(12) United States Patent
Tsao et al.

(10) Patent No.: US 6,883,151 B2
(45) Date of Patent: Apr. 19, 2005

(54) METHOD AND DEVICE FOR IC IDENTIFICATION

(75) Inventors: Hen-Wai Tsao, Taipei (TW); Yu-Cheng Fan, Chupei (TW)

(73) Assignee: National Taiwan University, Taipei (TW)

( * ) Notice: Subject to any disclaimer, the term of this patent is extended or adjusted under 35 U.S.C. 154(b) by 161 days.

(21) Appl. No.: 10/437,646

(22) Filed: May 13, 2003

(65) Prior Publication Data

US 2004/0230925 A1 Nov. 18, 2004

(51) Int. Cl.$^7$ .............................................. G06F 17/50
(52) U.S. Cl. ................. 716/4; 716/1; 716/16; 716/17; 713/164; 713/165; 713/166; 713/167; 714/726; 714/727; 714/728; 714/729
(58) Field of Search ................. 716/1, 4; 713/164–167; 714/726–729

(56) References Cited

U.S. PATENT DOCUMENTS

| | | | | |
|---|---|---|---|---|
| 5,771,375 A | * | 6/1998 | Mains | 713/503 |
| 6,148,436 A | * | 11/2000 | Wohl | 716/18 |
| 6,223,315 B1 | * | 4/2001 | Whetsel | 714/727 |
| 6,397,331 B1 | * | 5/2002 | Ober et al. | 713/164 |
| 6,658,615 B2 | * | 12/2003 | Whetsel | 714/727 |

OTHER PUBLICATIONS

Lofstrom et al., "IC Identification Circuit Using Device Mismatch," IEEE, Feb. 9, 2000, pp. 372–373.*
Quasem et al., "Benefits of a SoC–Specific Test Methodology," IEEE, May–Jun. 2003, pp. 68–77.*
Kahng et al., "Constraint–Based Watermarking Techniques for Design IP Protection," IEEE, Oct. 2001, pp. 1236–1252.*
Chapman et al., "IP Protection of DSP Algorithms for System on Chip Implementation," IEEE, Mar. 2000, pp. 854–861.*

* cited by examiner

*Primary Examiner*—Vuthe Siek

(57) ABSTRACT

The present invention provides a method for IC identification. It can be used to identify the origin of the IC design, wherein said IC comprises at least a testing circuit for testing the functional correctness of said IC, and said testing circuit is activated by a testing activation signal. The testing circuit, after receiving a testing signal, will generate a testing result. The identification method comprises the steps of (1). providing an original identification data representing the origin of the IC; (2). transforming the original identification data into a digital identification data; (3). providing an identification circuit for generating the digital identification data, wherein the identification circuit is activated by the testing activation signal, and generates the digital identification data; (4). integrating the identification circuit and the testing circuit into a composite circuit, wherein the composite circuit will be activated by the testing activation signal, receive the testing signal, process the digital identification data from identification circuit and the testing result from the testing circuit, and generate an output signal; (5). inputting the testing activation signal and the testing signal to the composite circuit, and waiting for the output signal; (6). receiving the output signal and processing the output signal to obtain digital identification data; and (7). interpreting the digital identification data to obtain the original identification data.

27 Claims, 5 Drawing Sheets

0100111  11101010000000
digital     testing result
identification
data
FIG. 2A
0100111  11101010000000  0100111  11101010000000  0100111
digital   testing result   digital   testing result   digital
identification              identification            identification
data                        data                      data
FIG. 2B
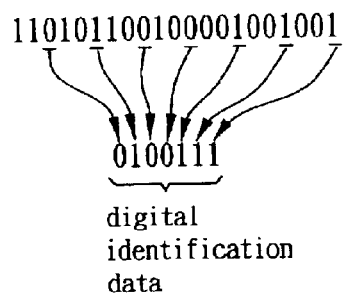
digital
identification
data
FIG. 2C
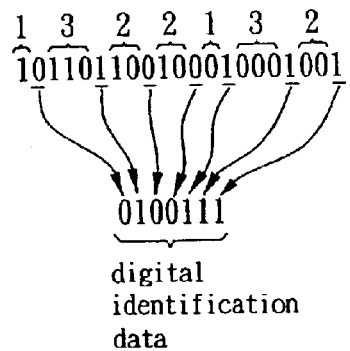
digital
identification
data
FIG. 2D

```
              digital
              identification
              data
            ⌢
            0100 1110000000
XOR     1110 1010000000  ◀── testing result
        ─────────────────
        1010 0100000000  ◀── operation result
```

FIG. 2E-1

```
        1010 0100000000  ◀── operation result

XOR     1110 1010000000  ◀── testing result
        ─────────────────
        0100 1110000000
              ⌣
              digital
              identification
              data
```

FIG. 2E-2

METHOD AND DEVICE FOR IC IDENTIFICATION

FIELD OF THE INVENTION

The invention relates to a method used in IC intellectual property protection, and more particularly to a method and a device for the detection and the verification of the origin of an IC design in order to provide legal protection in IC intellectual property.

BACKGROUND OF THE INVENTION

In the semiconductor industry, an integrated circuit that is designed and verified to provide certain functionality is treated as an intellectual property (IP). As the rapid development in IC design and manufacturing, more and more transistors are packed into a single chip. Conventional starting-from-scratch IC design approaches are unable to develop an IC comprising millions of logic gates or more in a short period of time to meet the market demands. Instead, by integrating one or more IP modules into a single chip, the IC developers can design chips that provide multiple functions a complete system, called system on a chip (SOC). For example, a chip used in computers may comprise a CPU module, a modem module, and a LAN module. The SOC design approach not only reduces the number of components and PCB cost, but also reduces the chip size and power consumption. With the demands of better, faster and cheaper designs, the reusability of IP becomes an important practice to shorten the development time, and reduce the overall cost.

In general, every IC includes a testing circuit for testing if the IC functions correctly. When the testing circuit is activated by a testing activation signal, it receives a testing signal, and generates a testing result. The test result is then interpreted to determine if the IC functions correctly. This is particularly important as a correctness test can only be performed in this way after the IC is packaged. It is, therefore, necessary to include the testing circuit of an IP module when that IP module is used in a design so that its correctness can be tested as well. However, as it is technically easy to copy IP modules, and as the concept of IP protection is still in its infancy, unauthorized use of IP modules is common, and difficult to prevent. Furthermore, when an IP module is incorporated into a chip design, it is difficult to identify the IP core from the finished layout, especially after the steps of synthesis, placement and routing. Current technology does not provide appropriate method for detecting and verifying the use of an IP module. This lack of IP protection may further inhibit the development of the industry.

SUMMARY OF THE INVENTION

The goal of the present invention is to provide an effective method for detecting and verifying the use of an IP module, and solves the problems detecting the origin of an IP module used in an IC design.

Another goal of the present invention is to provide a circuit that implements the aforementioned detection and verification method. This circuit can be included in an IP module for future identification of the origin of the IP module.

To achieve the aforementioned goal, the present invention provides a method for IC identification. It can be used to identify the origin of the IC design, wherein said IC comprises at least a testing circuit for testing the functional correctness of said IC, and said testing circuit is activated by a testing activation signal. The testing circuit, after receiving a testing signal, will generate a testing result. The identification method comprises the steps of (1). providing an original identification data representing the origin of the IC; (2). transforming the original identification data into a digital identification data; (3). providing an identification circuit for generating the digital identification data, wherein the identification circuit is activated by the testing activation signal, and generates the digital identification data; (4). integrating the identification circuit and the testing circuit into a composite circuit, wherein the composite circuit will be activated by the testing activation signal, receive the testing signal, process the digital identification data from identification circuit and the testing result from the testing circuit, and generate an output signal; (5). inputting the testing activation signal and the testing signal to the composite circuit, and waiting for the output signal; (6). receiving the output signal and processing the output signal to obtain digital identification data; and (7). interpreting the digital identification data to obtain the original identification data.

The present invention will become more obvious from the following description when taken in connection with the accompanying drawings which show, for purposes of illustration only, a preferred embodiment in accordance with the present invention.

BRIEF DESCRIPTION OF THE DRAWINGS

FIG. 2A shows the result after the first processing procedure of the present invention.

FIG. 2B shows the result after the second processing procedure of the present invention.

FIG. 2C shows the result after the third processing procedure of the present invention.

FIG. 2D shows the result after the fourth processing procedure of the present invention.

FIG. 2E-1 shows the result after the fifth processing procedure of the present invention.

FIG. 2E-2 shows the original identification data obtained from the fifth processing procedure of the present invention.

DETAILED DESCRIPTION OF THE INVENTION

Figure 1:
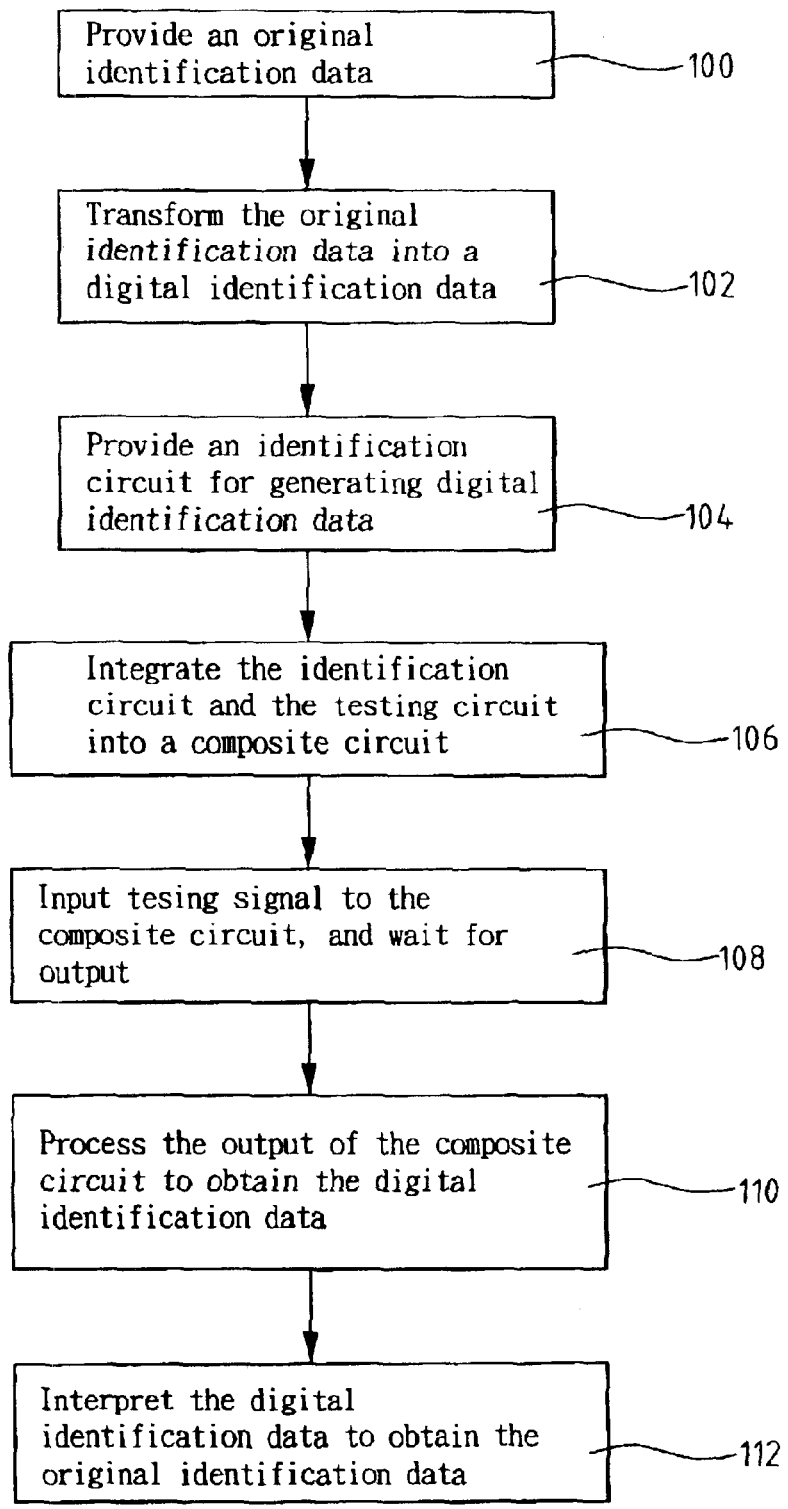
FIG. 1 shows the flow chart of the present invention.

Figure a shows the flow chart of the present invention. Step 100 is to provide an original identification data to represent the origin of the IC design. The original identification data can be any of the following: the name of the original designer, the name of the designing laboratory, the name of the designing company, etc. Step 102 is to transform the original identification data into a digital identification data. A simply implementation can be as follows: if the original identification data is made of mostly alphabets, a binary string can be obtained by transforming each character of the original identification data into a 1, and each white space into a 0. The binary string is the digital identification data. Of course, other serial numbers can also be used as the digital identification data as long as they can represent the name of the designer, laboratory, or the company. Step 104 is to provide an identification circuit that can generate the digital identification data. The identification circuit is activated by the testing activation signal and generates the digital identification data after the activation. Step 106 is to integrate the identification circuit and the testing circuit to form a composite circuit. The composite circuit is activated by the testing signal, and after receiving the testing signal, it processes the digital identification signals from the identification circuit and the testing result from the testing circuit in order to generate an output signal. Step 108 is to input the testing activation signal and the testing signal to the composite circuit, and wait for the output signal from the composite circuit. Step 110 is to process the output signal to obtain the digital identification data after receiving the output signal from the composite signal. Finally, step 112 is to interpret the digital identification data to obtain the original identification data.

The process procedure in step 106 can be any of the those as shown in FIGS. 2A, 2B, 2C, 2D and 2E-1. In these figures, the digital identification data generated by the identification circuit is assumed to be 0100111, and the testing result from the testing circuit is assumed to be 11101010000000.

FIG. 2A shows the result from the first processing procedure. In the first processing procedure, the composite circuit first outputs the digital identification data generated by the identification circuit, then outputs the testing results from the testing circuit. The result of the composite circuit, which is also the entire output signal, is shown in FIG. 2A.

FIG. 2B shows the result from the second processing procedure. In this procedure, the composite circuit continuously and alternately outputs the digital identification data generated by the identification circuit, and the testing results from the testing circuit. The result of the composite circuit, which is also the entire output signal, is shown in FIG. 2B.

FIG. 2C shows the result from the third processing procedure. In this procedure, the composite circuit first outputs n bits of the testing result, then outputs one bit of the identification data. Repeat the above steps until all the bits of the identification data are outputted. FIG. 2C shows an example wherein n is equal to 2. That is, the composite circuit outputs 2 bits of testing result, and then one bit of identification data. The advantage of this procedure is in that it provides higher security, and the value of n can be adjusted to meet various needs.

FIG. 2D shows the result from the fourth processing procedure. In this procedure, the composite circuit outputs n bits of the testing result, wherein n is a random number, then one bit of the digital identification data. Repeat the above steps until all the bits of the identification data are outputted. FIG. 2D shows an example where n is the sequence of the random values of {1, 3, 2, 2, 1, 3, 2}. The composite circuit first outputs one bit of testing result, then one bit of identification data. In the second iteration, the composite circuit outputs 3 bits of testing result, then one bit of identification data, while in the third iteration, 2 bits of testing result, followed by one bit of identification data, and so on. As the value of n is a random number, this procedure provides high security.

FIG. 2E-1 shows the result from the fifth processing procedure. In this procedure, the composite circuit performs an XOR operation on the testing result and the identification data, and outputs the result of the XOR operation. FIG. 2E-1 shows the identification data 0100111 filled with additional 0 at the end before the XOR operation with testing result 11101010000000 to obtain the final result 10100100000000 for output. This procedure provides higher security as the identification data is encrypted before output. Furthermore, in step 110, the output from the composite circuit is further processed to obtained identification data. For the original designer of the IP module, it is easy to decipher the output from the composite circuit as its processing procedure is known to the designer. FIG. 2E-2 shows an example of XOR-ing the output 10100100000000 with the testing result 11101010000000 to obtain the identification data 0100111.

Also, the identification circuit of step 104 and the composite circuit of step 106 can both be implemented with by coding in a hardware description language, such as VHDL or Verilog. The present invention will disclose the structures of the two embodiments of the identification circuit and the composite circuit in FIGS. 3A and 3B, respectively.

Figure 3A:
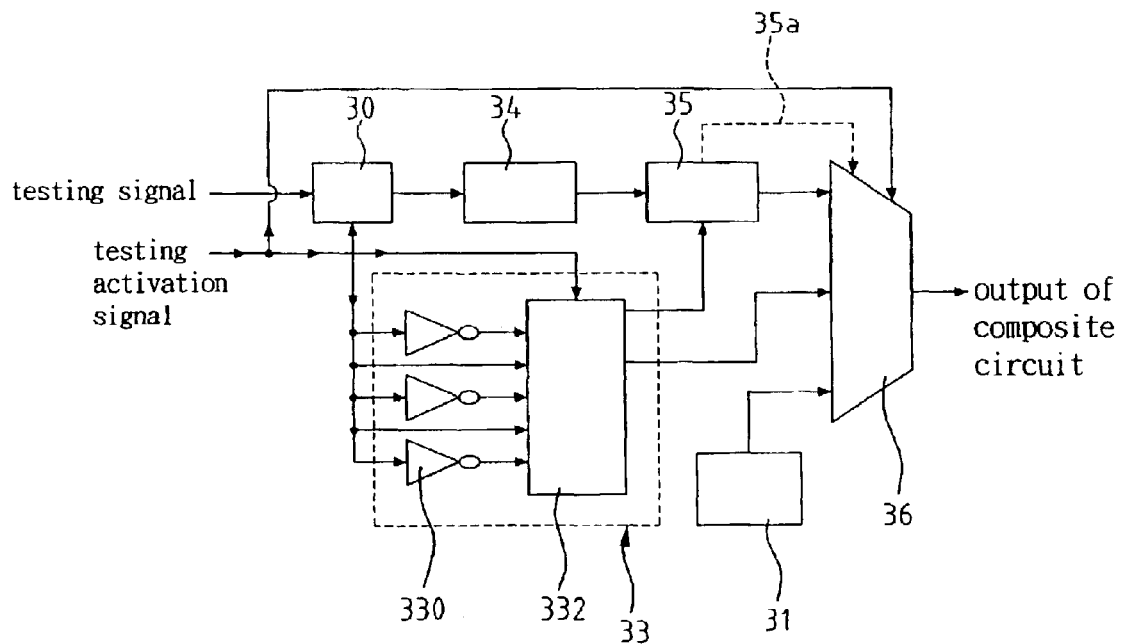
FIG. 3A shows the block diagram of the preferred embodiment of the composite circuit of the present invention.

FIG. 3A shows the preferred embodiment of the composite of the present invention. It is used in an IC, and more particular in an IP module protected by the Patent Law. The IC comprises at least a testing circuit 30 for testing the correctness of the module, wherein the testing circuit 30 is activated by a testing activation signal, and generates a testing result. FIG. 3A also includes an IP module 31, which is the design to be protected. The present invention of the composite circuit comprises:

1. an identification circuit 33, for generating a digital identification data from the original identification data represent the designer's identity, said identification circuit further comprising a plurality of inverters 330 and a shift register 332, wherein inverters 330 are at the input end for receiving the testing activation signal, and said shift register 332, also activated by said testing activation signal, is a parallel-in-serial-out (PISO) shift register and receives the output of said inverters 330 and a part of testing activation signal to generate a serial signal for output, said serial signal is the digital identification data;
2. a register 34, for receiving and storing the testing result from the testing circuit 30;
3. an arbitrator 35, for receiving the testing result stored in said register 34, for deciding the output sequence of the testing result and the digital identification data, and for receiving a notification signal from the shift register 332, said notification signal is to notify that said shift register 332 has finished transforming the input parallel signals into a serial signal; and
4. a multiplexer 36, for receiving testing result from arbitrator 35 and digital identification data from shift register 332, said multiplexer 36 is controlled by both said testing activation signal and said arbitrator 35 to select between the testing result and digital identification data for output.

FIG. 3A operates as follows. When the testing activation signal is 0, the IC performs its intended function module 31, whose result will be outputted by the multiplexer 36, regardless of the control signal 35a from the arbitrator 35. When the testing activation signal is 1, the IC is under testing. The testing circuit 30 and the shift register 332 are activated simultaneously. The testing circuit generates, in accordance with the testing signal, a testing result, which is stored in the register 34. In the meantime, the testing activation signal, through inverters 330, generates a parallel digital identification data, which is later transformed into a serial identification data by the shift register 332. The identification circuit 33, by arranging the number and the layout of the inverters 330, generates a serial digital identification data that is only known to the designer. Hence, the identification data can be used for identification. If the control signal 35*a* from the arbitrator is 1, the multiplexer 36 will select the testing result in the arbitrator 35 for output, on the other hand, when control signal 35*a* is 0, multiplexer 36 will select digital identification data for output. For example, the output shown in FIG. 2A is an example where the arbitrator 35 first outputs control signal 35*a* as 0, then sets control signal 35*a* to be 1.

Figure 3B:
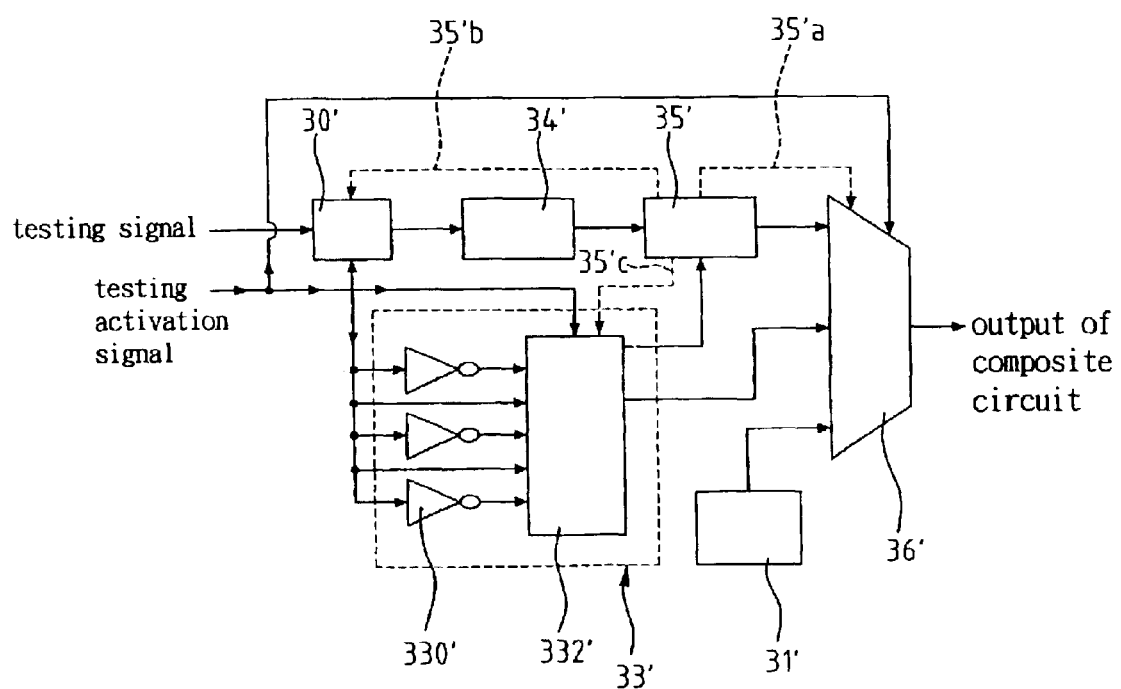
FIG. 3B shows the block diagram of another embodiment of the composite circuit of the present invention.

FIG. 3B shows another preferred embodiment of the composite of the present invention. It is used in an IC, and more particular in an WP module protected by the Patent Law. The IC comprises at least a testing circuit 30' for testing the correctness of the module, wherein the testing circuit 30' is activated by a testing activation signal, and generates a testing result. FIG. 3B also includes an IP module 31', which is the design to be protected. The present invention of the composite circuit comprises:

1. an identification circuit 33', for generating a digital identification data from the original identification data represent the designer's identity, said identification circuit further comprising a plurality of inverters 330' and a shift register 332', wherein inverters 330' are at the input end for receiving the testing activation signal, and said shift register 332', also activated by said testing activation signal, is a parallel-in-serial-out (PISO) shift register and receives the output of said inverters 330' and a part of testing activation signal to generate a serial signal for output, said serial signal is the digital identification data;
2. a register 34', for receiving and storing the testing result from the testing circuit 30';
3. an arbitrator 35', for receiving the testing result stored in said register 34', for deciding the output sequence of the testing result and the digital identification data, and for receiving a notification signal from the shift register 332', said notification signal is to notify that said shift register 332' has finished transforming the input parallel signals into a serial signal; and
4. a multiplexer 36', for receiving testing result from arbitrator 35' and digital identification data from shift register 332', said multiplexer 36' is controlled by both said testing activation signal and said arbitrator 35 to select between the testing result and digital identification data for output.

FIG. 3B operates as follows. When the testing activation signal is 0, the IC performs its intended function module 31', whose result will be outputted by the multiplexer 36', regardless of the control signal 35*a*' from the arbitrator 35'. When the testing activation signal is 1, the IC is under testing. The testing circuit 30' and the shift register 332' are activated simultaneously. The testing circuit generates, in accordance with the testing signal, a testing result, which is stored in the register 34'. In the meantime, the testing activation signal, through inverters 330', generates a parallel digital identification data, which is later transformed into a serial identification data by the shift register 332'. The identification circuit 33', by arranging the number and the layout of the inverters 330', generates a serial digital identification data that is only known to the designer. Hence, the identification data can be used for identification. If the control signal 35*a*' from the arbitrator is 1, the multiplexer 36' will select the testing result in the arbitrator 35' for output, on the other hand, when control signal 35*a*' is 0, multiplexer 36 will select digital identification data for output. In the meantime, arbitrator 35' will periodically send control signal 35'*b* to the testing circuit 30' and control signal 35'*c* to the shift register 332' to control their output for periodical output. For example, the output shown in FIG. 2B is an example where the arbitrator 35 first outputs control signal 35'*a* as 0, then sets control signal 35'*a* to be 1, and sends control signals 35'*b* and 35'*c*. By repeating the above steps, the composite circuit will outputs the result shown in FIG. 2B, where the testing result and identification data are alternatively outputted.

Figure 4:
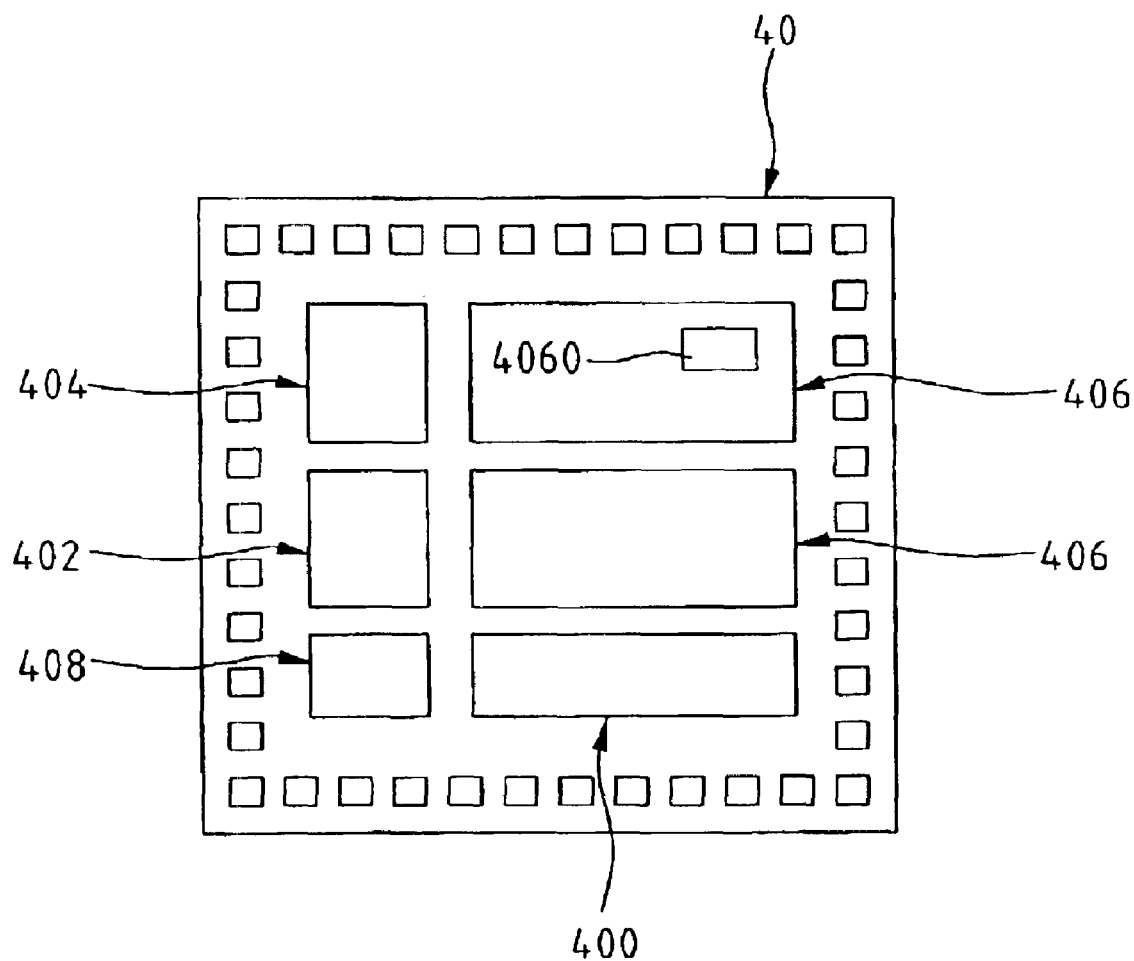
FIG. 4 shows the block diagram of the embodiment of an SOC chip utilizing the method of the present invention.

FIG. 4 shows an example of an SOC chip where the present invention can be used in. The SOC chip 40 comprises the following IC modules: a microprocessor 400, a memory module 402, an analog unit 404, a plurality of IP 406, an I/O unit 408, wherein the IP 406 is an IC module protected by Patent Law, and further includes a composite circuit 4060 of the present invention (as shown in FIGS. 3A and 3B). As the composite circuit 4060 of the present invention is included in the SOC chip 40, it is possible to identify the ownership of the design by interpreting the output from the composite circuit 4060 during testing the correctness of the the IP 406.

The present invention has the following advantages in comparison with the current technologies:

1. The use of the present invention for identification of the ownership of an IP module can be performed without opening the packaged IC, or using trace source code.
2. The present invention can perform the identification while testing the IP for correctness. It is convenient and efficient. It avoids the conventional way of identification by analyzing the layout, which is even more difficult when the finished design is packaged.
3. In addition to being used in IP based design methodology, the present invention can also be used in cell-based design methodology for protecting the hardware program code from piracy. When a hardware program code is pirated, it can be easily identified and proofed.
4. The present invention can be easily implemented in hardware description language, such as VDHL and Verilog. This coincides the current trend of IC design by using software programming, instead of using complicated logic circuits. Furthermore, the hardware description language provides more flexibility for re-coding, and more protection to the IP. Hence, the present invention is easy for future expansion.

While we have shown and described the embodiment in accordance with the present invention, it should be clear to those skilled in the art that further embodiments may be made without departing from the scope of the present invention.

What is claimed is:

1. A method for IC identification, to be used for identifying the origin of an IC design, wherein said IC comprises at least a testing circuit for testing the functional correctness of said IC, and said testing circuit is activated by a testing activation signal, and will generate a testing result after the testing, said identification method comprises the steps of (a). providing an original identification data representing the origin of said IC;

(b). transforming said original identification data into a digital identification data;

(c). providing an identification circuit for generating said digital identification data, wherein said identification circuit is activated by a testing activation signal, and generates said digital identification data;

(d). integrating said identification circuit and said testing circuit into a composite circuit, wherein said composite circuit will be activated by said testing activation signal, receive said testing signal, process said digital identification data from said identification circuit and said testing result from said testing circuit, and generate an output signal;

(e). inputting said testing activation signal and said testing signal to said composite circuit, and waiting for said output signal;

(f). receiving said output signal and processing said output signal to obtain a digital identification data; and (g). interpreting said digital identification data to obtain said original identification data.

2. The IC identification method as in claim 1, wherein step (c) uses a hardware description language to code said identification circuit.

3. The IC identification method as in claim 1, wherein step (d) uses a hardware description language to code said composite circuit.

4. The IC identification method as in claim 1, wherein said composite circuit in step (d) first outputs said digital identification data from said identification circuit, then outputs said testing result from said testing circuit.

5. The IC identification method as in claim 1, wherein said composite circuit in step (d) outputs, alternately and continuously, said digital identification data from said identification circuit and said testing result from said testing circuit.

6. The IC identification method as in claim 1, wherein said composite circuit in step (d) processes said digital identification data from said identification circuit and said testing result from said testing circuit in the following steps:

(d1). said composite circuit outputs n bits of said testing results, then outputs one bit of said digital identification data, wherein n is an integer of fixed value; and (d2). repeat step (d1) until all the bits of said digital identification data are outputted.

7. The IC identification method as in claim 1, wherein said composite circuit in step (d) processes said digital identification data from said identification circuit and said testing result from said testing circuit in the following steps:

(d1). said composite circuit outputs n bits of said testing results, then outputs one bit of said digital identification data, wherein n is a random number of integer; and (d2). repeat step (d1) until all the bits of said digital identification data are outputted.

8. The IC identification method as in claim 1, wherein said composite circuit in step (d) processes said digital identification data from said identification circuit and said testing result from said testing circuit by performing XOR operation, and outputs the result from said XOR operation.

9. The IC identification method as in claim 1, wherein said IC is an IP module protected by Patent Law.

10. The IC identification method as in claim 1, wherein said original identification data can be any of the following: the name of the designer, the name of the designing laboratory, the name of the designing company, or the identification of the designing company.

11. The IC identification method as in claim 2 or claim 3, wherein said hardware description language can be any of the following: Verilog, VHDL.

12. The IC identification method as in claim 8, wherein step (f) performs an XOR operation to obtain said digital identification data.

13. The IC identification method as in claim 10, wherein step (b) transforms each character of said original identification data into a 1, and each blank into a 0 to obtain a sequence of binary bits, which is said digital identification data.

14. A composite circuit, used in an IC which comprises at least a testing circuit for testing the correctness of said IC, wherein said testing circuit is activated by a testing activation signal, and generates a testing result, said composite circuit comprises:

(1). an identification circuit, for generating a digital identification data from the original identification data represent said IC's identity, said identification circuit further comprising a plurality of inverters and a shift register, wherein said inverters are at the input end for receiving the testing activation signal, and said shift register, also activated by said testing activation signal, receives the output of said inverters and a part of said testing activation signal to generate a serial signal for output, said serial signal is the digital identification data;

(2). a register, for receiving and storing said testing result from said testing circuit;

(3). an arbitrator, for receiving said testing result stored in said register, and for deciding the output sequence of said testing result and said digital identification data; and (4). a multiplexer, for receiving said testing result from said arbitrator and said digital identification data from shift register, said multiplexer is controlled by both said testing activation signal and said arbitrator to select between said testing result and said digital identification data for output.

15. The composite circuit as in claim 14, wherein said shift register is a parallel-in-serial-out (PISO) shift register.

16. The composite circuit as in claim 14, wherein said arbitrator receives a notification signal from said shift register, said notification signal is to notify that said shift register has finished transforming the input parallel signals into a serial signal.

17. The composite circuit as in claim 14, wherein said IC is an IP module protected by Patent Law.

18. A composite circuit, used in an IC which comprises at least a testing circuit for testing the correctness of said IC, wherein said testing circuit is activated by a testing activation signal, and generates a testing result, said composite circuit comprises:

(1). an identification circuit, for generating a digital identification data from the original identification data represent said IC's identity, said identification circuit further comprising a plurality of inverters and a shift register, wherein said inverters are at the input end for receiving the testing activation signal, and said shift register, also activated by said testing activation signal, receives the output of said inverters and a part of said testing activation signal to generate a serial signal for output, said serial signal is the digital identification data;

(2). a register, for receiving and storing said testing result from said testing circuit;

(3). an arbitrator, for receiving said testing result stored in said register, and for deciding the output sequence of said testing result and said digital identification data, said arbitrator also periodically makes said testing circuit and said shift register repeatedly generates said testing result and said digital identification data; and (4). a multiplexer, for receiving said testing result from said arbitrator and said digital identification data from shift register, said multiplexer is controlled by both said testing activation signal and said arbitrator to select between said testing result and said digital identification data for output.

19. The composite circuit as in claim 18, wherein said shift register is a parallel-in-serial-out (PISO) shift register.

20. The composite circuit as in claim 18, wherein said arbitrator receives a notification signal from said shift register, said notification signal is to notify that said shift register has finished transforming the input parallel signals into a serial signal.

21. The composite circuit as in claim 18, wherein said IC is an IP module protected by Patent Law.

22. An IC comprises a composite circuit, said IC also comprises at least a testing circuit for testing the correctness of said IC, wherein said testing circuit is activated by a testing activation signal, and generates a testing result, said composite circuit comprises:

(1). an identification circuit, for generating a digital identification data from the original identification data represent said IC's identity, said identification circuit further comprising a plurality of inverters and a shift register, wherein said inverters are at the input end for receiving the testing activation signal, and said shift register, also activated by said testing activation signal, receives the output of said inverters and a part of said testing activation signal to generate a serial signal for output, said serial signal is the digital identification data;

(2). a register, for receiving and storing said testing result from said testing circuit;

(3). an arbitrator, for receiving said testing result stored in said register, and for deciding the output sequence of said testing result and said digital identification data; and (4). a multiplexer, for receiving said testing result from said arbitrator and said digital identification data from shift register, said multiplexer is controlled by both said testing activation signal and said arbitrator to select between said testing result and said digital identification data for output.

23. The IC as in claim 22, wherein said IC is an IP module protected by Patent Law.

24. An IC comprises a composite circuit, said IC also comprises at least a testing circuit for testing the correctness of said IC, wherein said testing circuit is activated by a testing activation signal, and generates a testing result, said composite circuit comprises:

(1). an identification circuit for generating a digital identification data from the original identification data represent said IC's identity, said identification circuit further comprising a plurality of inverters and a shift register, wherein said inverters are at the input end for receiving the testing activation signal, and said shift register, also activated by said testing activation signal, receives the output of said inverters and a part of said testing activation signal to generate a serial signal for output, said serial signal is the digital identification data;

(2). a register, for receiving and storing said testing result from said testing circuit;

(3). an arbitrator, for receiving said testing result stored in said register, and for deciding the output sequence of said testing result and said digital identification data, said arbitrator also periodically makes said testing circuit and said shift register repeatedly generates said testing result and said digital identification data; and (4). a multiplexer, for receiving said testing result from said arbitrator and said digital identification data from shift register, said multiplexer is controlled by both said testing activation signal and said arbitrator to select between said testing result and said digital identification data for output.

25. The IC as in claim 24, wherein said IC is an IP module protected by Patent Law.

26. A SOC chip comprises a composite circuit, wherein said composite circuit is used in at least an IC included in said SOC, and said IC comprises at least a testing circuit for testing the correctness of said IC, wherein said testing circuit is activated by a testing activation signal, and generates a testing result, said composite circuit comprises:

(1). an identification circuit, for generating a digital identification data from the original identification data represent said IC's identity, said identification circuit further comprising a plurality of inverters and a shift register, wherein said inverters are at the input end for receiving the testing activation signal, and said shift register, also activated by said testing activation signal, receives the output of said inverters and a part of said testing activation signal to generate a serial signal for output, said serial signal is the digital identification data;

(2). a register, for receiving and storing said testing result from said testing circuit;

(3). an arbitrator, for receiving said testing result stored in said register, and for deciding the output sequence of said testing result and said digital identification data; and (4). a multiplexer, for receiving said testing result from said arbitrator and said digital identification data from shift register, said multiplexer is controlled by both said testing activation signal and said arbitrator to select between said testing result and said digital identification data for output.

27. A SOC chip comprises a composite circuit, wherein said composite circuit is used in at least an IC included in said SOC, and said IC comprises at least a testing circuit for testing the correctness of said IC, wherein said testing circuit is activated by a testing activation signal, and generates a testing result, said composite circuit comprises:

(1). an identification circuit, for generating a digital identification data from the original identification data represent said IC's identity, said identification circuit further comprising a plurality of inverters and a shift register, wherein said inverters are at the input end for receiving the testing activation signal, and said shift register, also activated by said testing activation signal, receives the output of said inverters and a part of said testing activation signal to generate a serial signal for output, said serial signal is the digital identification data;

(2). a register, for receiving and storing said testing result from said testing circuit;

(3). an arbitrator, for receiving said testing result stored in said register, and for deciding the output sequence of said testing result and said digital identification data, said arbitrator also periodically makes said testing circuit and said shift register repeatedly generates said testing result and said digital identification data; and (4). a multiplexer, for receiving said testing result from said arbitrator and said digital identification data from shift register, said multiplexer is controlled by both said testing activation signal and said arbitrator to select between said testing result and said digital identification data for output.

* * * * *